United States Patent [19]

Thompson

[11] Patent Number: 4,480,331
[45] Date of Patent: Oct. 30, 1984

[54] INJECTION LASER WITH AN INVERTED WAVEGUIDING RIB

[75] Inventor: George H. B. Thompson, Sawbridgeworth, England

[73] Assignee: International Standard Electric Corporation, New York, N.Y.

[21] Appl. No.: 382,507

[22] Filed: May 27, 1982

[30] Foreign Application Priority Data

Jul. 2, 1981 [GB] United Kingdom ................ 8120465

[51] Int. Cl.³ .............................................. H01S 3/19
[52] U.S. Cl. ...................................... 372/45; 357/17; 372/46
[58] Field of Search ................ 372/45, 46, 44; 357/17

[56] References Cited

U.S. PATENT DOCUMENTS 4,360,919  11/1982  Fujiwara et al. ..................... 372/46

Primary Examiner—James W. Davie
Attorney, Agent, or Firm—John T. O'Halloran; Peter R. Ruzek

[57] ABSTRACT

A transverse mode stabilized injection laser with a planar active layer is provided with a transverse waveguiding effect by the presence of a rib of intermediate refractive index material protruding through a blocking layer overlying the active layer. Optionally the blocking layer may include high refractive index material to provide additional waveguiding effect and controlled attenuation of higher order transverse modes.

11 Claims, 3 Drawing Figures

INJECTION LASER WITH AN INVERTED WAVEGUIDING RIB

BACKGROUND OF THE INVENTION

This invention relates to semiconductor lasers, and in particular to transverse mode stabilized lasers with planar active layers.

One example of such a laser is described by T. Furuse et al in a paper entitled "Transverse Mode Stabilised AlGaAs BH laser having a Built-in Plano-convex Waveguide" presented at The Optical Communication Conference, Amsterdam, Sept. 17-19, 1979, 2.2-1 to 2.2-4. That paper discloses a construction in which a transverse waveguiding effect is provided for a planar active layer by the presence of an inverted rib of intermediate band gap material grown before the growth of the active layer. However, this structure has several disadvantages, especially as far as the smooth and proper epitaxial growth of the layers is concerned, because of the presence of the inverted rib on the substrate before the formation of the active layer.

SUMMARY OF THE INVENTION

Accordingly, it is an object of the present invention to avoid the disadvantages of the prior art.

More particularly, it is an object of the invention to provide an injection laser element of the type here under consideration which does not possess the disadvantages of the conventional laser elements of this type.

It is yet another object of the present invention to develop a laser element of the above-type which has an improved waveguiding effect in comparison with conventional laser elements.

In pursuance of these objects and others which will become apparent hereafter, one feature of the present invention resides in an injection laser element having a plurality of layers epitaxially grown upon a substrate, this plurality of layers including a planar active layer sandwiched between lower refractive index higher band gap upper and lower passive layers, a blocking layer, an intermediate index layer whose refractive index is intermediate that of the active layer and that of the upper passive layer, wherein the upper passive and the intermediate index layers both have the same conductivity type which is the opposite of that of the blocking layer, wherein the blocking layer covers the upper passive layer except in the region of a stripe thereof extending normally from laser end face to laser end face, above which stripe the blocking layer is absent, wherein the intermediate index layer extends in the region of the stripe into material of lower refractive index and is contiguous with the material of the upper passive layer, and wherein the refractive indices of the intermediate index, blocking, upper passive and active layers, in relation to their thickness are such that the intermediate index layer is optically coupled at the laser emission wavelength with the active layer in such a way as to provide a guided wavelength in the direction of light propagation that is shorter in the region of the active layer overlaid by the stripe than in the adjacent regions of the active layer.

The present invention is thus concerned with a structure in which a transverse waveguiding effect is provided by the presence of an inverted rib of intermediate band gap material grown after the growth of the active layer. One particular advantage of this structure is that it employs a planar substrate surface on which to grow the epitaxial layers. This means that the substrate surface can be etched back with an unsaturated melt before growth of the first epitaxial layer is commenced, and furthermore this first layer can be a relatively thick layer to ensure that growth is proceeding properly. Moreover the provision of self alignment of a current confining structure with the waveguide is relatively straightforward.

With this structure, it is possible to provide additional discrimination against the higher order transverse modes by making a part of the thickness of the blocking layer out of higher refractive index material than that of the intermediate index layer so that the higher order modes are preferentially attenuated by leakage into this part of the blocking layer.

A particularly advantageous construction of the injection laser element is obtained when the plurality of layers further includes a low index layer covering the intermediate index layer and being of a material with a lower refractive index than the material of the intermediate index layer.

The material of the blocking layer may advantageously have substantially the same refractive index as the material of the upper passive layer. However, it is especially advantageous when the material of the blocking layer has a refractive index exceeding that of the material of the intermediate index layer. It is also advantageous in this context when the material of the blocking layer has a refractive index substantially equal to that of the material of the active layer.

According to an advantageous aspect of the present invention, the blocking layer has a first portion contiguous with the upper passive layer and being of a material of substantially the same refractive index as the material of the upper passive layer, and a second portion covering the first portion and being of a material with a refractive index exceeding that of the material of the intermediate index layer, and especially substantially equal to that of the material of the active layer. Generally speaking, the blocking layer has at least a portion of a refractive index exceeding that of the material of the intermediate index layer which is contiguous with the upper passive layer and which is so optically coupled with the material of said active layer as to provide discrimination against higher order transverse modes propagating under the stripe.

Especially good results are obtained when the active layer is of quaternary (In,Ga) (As,P), where the upper and lower passive layer is of arsenic-substituted quaternary (In,Ga)(As,P) in which the proportional amount of arsenic substituted for phosphorus is between one-half and one-third of the equivalent substitution amount in the material of the active layer.

BRIEF DESCRIPTION OF THE DRAWING

Above-mentioned and other features and objects of this invention will become more apparent by reference to the following description taken in conjunction with the accompanying drawing, in which.

DETAILED DESCRIPTION OF THE PREFERRED EMBODIMENTS

Figure 1:
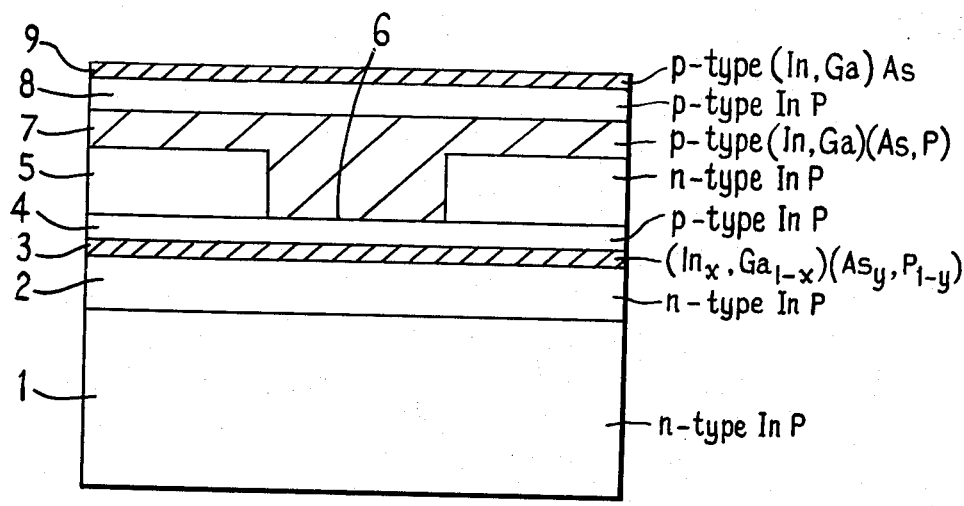
FIG. 1 is a schematic cross-sectional view of a laser whose blocking layer is made of low refractive index material.

Referring now to the drawing in detail, it may be seen that the reference numeral 1 has been used to identify a substrate on which the laser element of the present invention is epitaxially grown. The substrate 1 of FIG. 1 is an n-type indium phosphide substrate. In the following discussion, the present invention will be explained as being used in a laser element having an active layer 3 of the quaternary (In,Ga) (As,P) material. However, it will be apparent that the structures employed here can be used in other semiconductor material systems or combinations as well.

The substrate surface upon which the layers of the device are to be epitaxially grown is given a final clean-up preparation by etching it with an unsaturated melt of indium phosphide, and then the first epitaxial layer, an n-type indium phosphide lower passive layer 2, is grown, typically several microns thick. Next the quaternary $(In_x, Ga_{1-x}) (As_y, P_{1-y})$ active layer 3 is grown on the lower passive layer 2. This active layer 3 is typically about 0.2 microns thick and p-type, y may typically be 0.6. The active layer 3 is covered by the epitaxial growth of a thin, typically about 0.3 microns thick, upper passive layer 4 of p-type indium phosphide, and this in turn is covered by an n-type blocking layer 5 of indium phosphide. The blocking layer 5 is typically about 0.6 microns thick. Standard photolithographic techniques are used to etch through the blocking layer to expose a stripe 6 of the material of the underlying upper passive layer 4, this stripe extending normally from one end face of the laser element to the other. This stripe 6 may be typically about 2 to 4 microns in width. Next an intermediate index layer 7 is grown to cover the blocking layer and the exposed stripe 6 of the passive layer 4. This layer 7 is of p-type material and is made of quaternary (In,GA) (As,P) having a refractive index intermediate that of indium phosphide and that of the quaternary material of the passive layer 3. Preferably the proportional amount of arsenic substituted for phosphorus in the material of the layer 7 is between one half and one third of the equivalent substitution in the material of the active layer 3. The intermediate index layer is covered with a p-type low index layer 8 whose refractive index is less than that of the intermediate index layer 7. Conveniently the layer 8 is made of indium phosphide, and this is covered with a p+-type contact layer 9 to which contact is made. The layer 9 is typically of ternary (In,Ga) As or may be of quaternary (In,Ga)(As,P).

The composition and construction of this laser element is designed so that the optical field penetrates to a not insignificant extent from the active layer 3 through the upper passive layer 4 and into the region of the intermediate index layer 7 overlying the stripe 6. This penetration of the optical field into the intermediate index material is designed to provide a transverse waveguiding effect by shortening the guided wavelength $\lambda_z$ of the laser emission in the region of the active layer 3 underlying the stripe in comparison with that in the adjacent regions of the active layer 3. The guided wavelength is related to the effective refractive index $n_{eff}$ by the formula $\lambda_z n_{eff} = \lambda_o$, where $\lambda_o$ is the free space wavelength of the light. Neglecting fringe effects, the effective refractive index is determined in relation to the variation of optical intensity I and refractive index $n_y$ in the direction normal to the layers (the y-direction), with the refractive index at any point making its contribution to the effective index approximately in proportion to the optical intensity at that point.

Optical coupling between a first waveguide constituted by the active layer 3 bounded by its associated upper and lower passive layers 4 and 2, and a second waveguide constituted by the region of the intermediate index layer 5 overlying the stripe 6 bounded by the low index and upper passive layers 8 and 4 results in an increase in $n_{eff}$ and hence a shortening of the guided wavelength $\lambda_z$ provided that $n_{eff}$ for the first guide computed for an infinite separation of the two guides is greater than $n_{eff}$ for the second guide similarly computed for an infinite separation of the two guides. This condition is readily met provided that the condition if avoided in which the intermediate index layer 5 is thick in comparison with the active layer 3 and/or too close in value of refractive index to that of the active layer 3. In certain circumstances the presence of the low index layer 8 can be dispensed with in the formation of the second waveguide referred to earlier in this paragraph.

The blocking layer 6 is made of n-type material so that it presents a reverse biased p-n junction to confine current flow through the device and concentrate its flow across the active layer 3 to the region registering with the stripe 6. In this way the current confinement is self aligned with the transverse waveguiding effect.

For many applications it is desirable to discriminate against the higher order transverse modes, usually restricting operation to the zero order transverse mode. For these applications the above described laser element can be designed so that, in the absence of electrical drive, only the zero order mode is below cut-off. This will provide a measure of discrimination against the higher order transverse modes, but it may be found that under these circumstances the cut-off modes are not sufficiently heavily attenuated to prevent their propagation by gain guiding at drive levels for which single mode operation is required. This problem increases with increasing stripe width. For stripe widths in the region of 1 to 2 microns lorder and higher transverse modes are cut off with a structure providing relatively strong transverse waveguiding. For wider stripes 6, the transverse waveguiding is weaker and correspondingly the higher order modes are not so heavily attenuated.

This problem may be ameliorated by making modifications to the structure of FIG. 1 to include high index material in the blocking layer into which the optical field of the higher order transverse modes will preferentially penetrate and contribute additional attenuation discriminating preferentially against higher order transverse modes. These modifications are depicted in FIG. 2.

Figure 2:
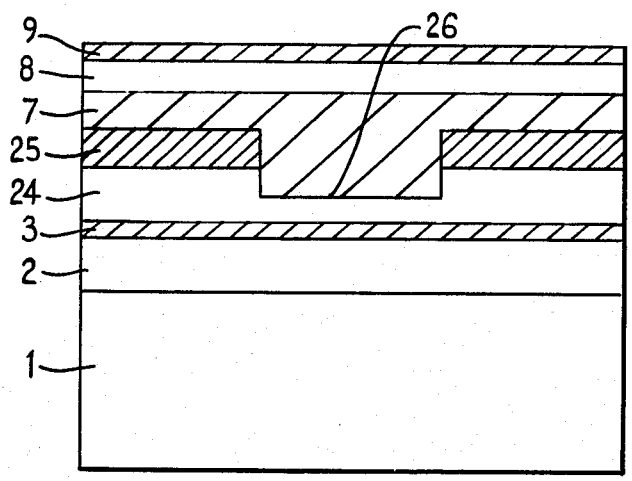
FIG. 2 is a view similar to FIG. 1, but of a laser whose blocking layer is made of high refractive index material.

Referring to FIG. 2, the preparation of this laser element follows the same pattern of growth at least as far as the growth of the active layer 3 is concerned, The next layer to be grown is an upper passive layer 24 of p-type indium phosphide. The layer 24 is covered with an n-type blocking layer 25 of quaternary (In,Ga) (As,P) and then standard photolithographic techniques are used to etch through this blocking layer 25 and part way through the underlying upper passive layer 24 to expose a stripe 26 of the material of the upper passive layer 24. This stripe 26 is just like the stripe 6 of the device of FIG. 1, that is to say it is typically 2 to 4 microns wide, and extends normally from one end face of the laser element to the other. The preparation of the laser element then continues in the same way as that of the laser element of FIG. 1, with the growth of the intermediate index, low index and contact layers 7, 8 and 9.

Just as in the laser element of FIG. 1, the penetration of the optical field from the active layer 3 through the upper passive layer 24 and into the region of the intermediate index layer 7 defined by the stripe 26 is designed to increase the effective refractive index in comparison with the value it would have if this optical field did not penetrate as far as the intermediate index material of the layer 7. The laser element is also designed so that, outside the region of the stripe 26, the optical field will penetrate into the region of the quaternary material of the blocking layer 25. This is so that the blocking layer 25 shall guide light transversely away from the stripe region 26 and thus provide attenuation which is stronger for higher order modes. The material of the blocking layer 25 is made of higher index material than that of the intermediate index layer 7. Its refractive index may be smaller or greater than that of the material of the active layer 3, but generally it is preferred to make it equal to it.

It will be appreciated that the high index blocking layer 25 bounded by the upper passive layer 24 and by the intermediate index layer 7 constitutes another waveguiding structure optically coupled to the waveguiding structure constituted by the active layer 3 bounded by the two passive layers 2, 24. This optical coupling will have an effect both upon the guided wavelength of light propagating in the regions of the active layer 3 outside that overlaid by the stripe 26, and also upon the guided wavelength of any wave that may be excited in the blocking layer 25 itself. For the blocking layer 25 to carry light obliquely away for the central stripe region 26, it must be made to have an effective refractive index that is greater than that of the active layer 3 under the stripe 6. Its effect on the guided wavelength in the regions of the active layer 3 beneath it is therefore the opposite of that produced by the layer 26, so that the effective index is lowered. As a result the waveguiding action for light propagating in the region of the active layer under the stripe 26 is somewhat augmented.

Because there is no effective lateral waveguiding effect for light coupled into the "blocking layer waveguide", this waveguide provides radiative loss. This loss is wanted because it is greater for the higher order transverse modes, but since it also contributes some loss to the zero order mode, the blocking layer 25 does not approach as close to the active layer 3 as does the intermediate index layer 7 in the region of the stripe 26. By this means the loss to the zero order mode is kept to an acceptable value.

Any required increase in transverse waveguiding consequent upon narrowing the stripe width can be provided by reducing the spacing between the intermediate index layer 7 and the active layer 3, leaving the spacing between the high index material of the blocking layer 25 and that of the active layer 3 unchanged.

The use of high index material in a blocking layer for preferentially attenuating higher order transverse modes has been previously described by H. Nishi et al in the paper entitled "Self-aligned Structure in InGaAsP-/InP DH lasers"0 appearing in Applied Physics Letters, Volume 35, No. 3, pages 232-4 (August 1979), but in that instance low index material fills the space left by the etching of the stripe in the blocking layer. This means that transverse waveguiding is provided solely by the effect of the blocking layer being optically coupled with the active layer. The limitation of this is that the technique becomes increasingly inefficient with decreasing stripe width because a decreased stripe width requires a correspondingly stronger transverse waveguiding effect and, if this is provided solely by the blocking layer, it produces an increased attenuation of the zero order transverse mode.

It should be appreciated that complementary conductivity type versions of both structures can be grown using p-type substrates. The use of a p-type substrate can be advantageous because this necessitates the use of n-type material for the intermediate index layer. Under these circumstances the problem of carrier leakage by diffusion from the active layer into the nearby intermediate index material is less on account of the fact that the mobility of holes is less than that of electrons.

One difficulty in manufacturing a laser element as depicted in FIG. 2 concerns terminating the etching so as to have the requisite thickness of the upper passive layer 24 beneath the stripe 26. For materials for which selective etches exist which will etch material of one conductivity type significantly faster than material of the other, this problem can be ameliorated by adopting the construction illustrated in FIG. 3, in which the upper passive layer 4 is essentially the same as that of the device described with reference to FIG. 1. This is covered with a blocking layer deposited in two parts comprising a first part or portion 35A of low index indium phosphide. covered by a second part or portion 35B of high index quaternary (In,Ga)(As,P) of the same conductivity type and having the same composition as blocking layer 25 of the device of FIG. 2. This allows the etching to be terminated upon exposure of the opposite conductivity type material of layer 4. In all other respects, the construction of this device is the same as that of the device previously described with reference to FIG. 2, with the proviso, of course, that the choice of which of the two complementary conductivity type versions of the structure to construct is determined by the need to have the layer 4 composed of material of the conductivity type less readily etched by the particular etch used for the selective etching.

Figure 3:
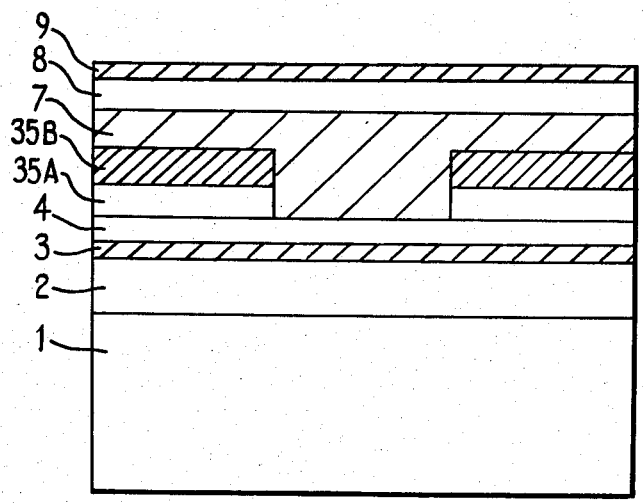
FIG. 3 is a view similar to FIGS. 1 and 2, but of a laser in which a part of the thickness of the blocking layer is made of high refractive index material and another part of low index material.

The structure of FIG. 3 also supplies a more reliable current blocking action since its reverse biassed junction is located in InP material. Because InP is of higher bandgap than the active layer, no leakage current is generated at the p-n junction by absorption of spontaneous electro luminescence emitted by the active layer 3.

While I have described above the principles of my invention in connection with specific apparatus, it is to be clearly understood that this description is made only by way of example and not as a limitation to the scope of my invention as set forth in the accompanying claims.

I claim:

1. An injection laser element epitaxially grown on a substrate and having two opposite substantially parallel end faces, comprising, as considered in the growth direction:

a lower passive layer of one conductivity type, a planar active layer of the other conductivity type, an upper passive layer sandwiching said active layer between itself and said lower passive layer, and being of a material with a lower refractive index and higher band gap than, and of the same conductivity type as, the material of said active layer, a blocking layer covering said upper passive layer except for a region of a stripe extending from one to the other of the opposite end faces substantially normal thereto, and an intermediate index layer of a material with a refractive index intermediate those of the materials of said active and upper passive layers and of a conductivity type identical to that of the material of said upper passive layer and opposite to that of the material of said blocking layer, said intermediate index layer covering said blocking layer and extending into said stripe region into contiguous relationship with the material of said upper passive layer, the refractive indexes of the materials of said intermediate index, blocking, upper passive, and active layers being such in relation to one another and to the thicknesses of the respective layers that said intermediate layer is so optically coupled at the laser emission wavelength with said active layer as to provide a guided wavelength in the direction of propagation that is shorter in the region of said active layer that is overlaid by said stripe than in the adjacent regions of said active layer.

2. The injection laser element as defined in claim 1, wherein said plurality of layers further includes a low index layer covering said intermediate index layer and being of a material with a lower refractive index than the material of said intermediate index layer.

3. The injection laser element as defined in claim 1, wherein the material of said blocking layer has substantially the same refractive index as the material of said upper passive layer.

4. The injection laser element as defined in claim 1, wherein the material of said blocking layer has a refractive index exceeding that of the material of said intermediate index layer.

5. The injection laser element as defined in claim 4, wherein the material of said blocking layer has a refractive index substantially equal to that of the material of said active layer.

6. The injection laser element as defined in claim 1, wherein said blocking layer has a first portion contiguous with said upper passive layer and being of a material of substantially the same refractive index as the material of said upper passive layer, and a second portion covering said first portion and being of a material with a refractive index exceeding that of the material of said intermediate index layer.

7. The injection laser element as defined in claim 6, wherein the material of said second portion of said blocking layer has a refractive index substantially equal to that of the material of said active layer.

8. The injection laser element as defined in claim 1, wherein said blocking layer has at least a portion of a refractive index exceeding that of the material of said intermediate index layer which is contiguous with said upper passive layer and which is so optically coupled with the material of said active layer as to provide discrimination against higher order transverse modes propagating under said stripe.

9. The injection laser element as defined in claim 1, wherein said active layer is of quaternary (In,Ga)-(As,P).

10. The injection laser element as defined in claim 9, wherein said upper and lower passive layers are of indium phosphide.

11. The injection laser element as defined in claim 1, wherein said active layer is of arsenic-substituted quaternary (In,Ga)(As,P) in which the proportional amount of arsenic substituted for phosporus is between one-half and one-third of the equivalent substitution amount in the material of said active layer.

* * * * *